United States Patent [19]

Itoh et al.

[11] Patent Number: 5,176,791
[45] Date of Patent: Jan. 5, 1993

[54] METHOD FOR FORMING CARBONACEOUS FILMS

[75] Inventors: Kenji Itoh, Zama; Osamu Aoyagi, Atsugi, both of Japan

[73] Assignee: Semiconductor Energy Laboratory Co., Ltd., Kanagawa, Japan

[21] Appl. No.: 731,353

[22] Filed: Jul. 15, 1991

Related U.S. Application Data

[63] Continuation of Ser. No. 392,547, Aug. 11, 1989, abandoned.

[30] Foreign Application Priority Data

Aug. 11, 1988 [JP] Japan .............................. 63-202534

[51] Int. Cl.⁵ .............................................. C23F 1/00
[52] U.S. Cl. .................................. 156/643; 156/651; 134/1
[58] Field of Search .................. 156/643, 651; 427/39; 134/1

[56] References Cited

U.S. PATENT DOCUMENTS

| | | | |
|---|---|---|---|
| 4,786,352 | 11/1988 | Benzing | 156/643 |
| 4,797,178 | 1/1989 | Bui | 134/1 |
| 4,816,113 | 3/1989 | Yamazaki | 134/1 |

*Primary Examiner*—W. Gary Jones
*Assistant Examiner*—Charles K. Friedman
*Attorney, Agent, or Firm*—Sixbey, Friedman, Leedom & Ferguson

[57] ABSTRACT

Cleaning a device to make a film made from carbon or containing carbon as a main ingredient is carried out by etching the interior of a deposition chamber where the film is formed, with an etching gas in a plasma state selected from the group of hydrogen, oxygen, and a gaseous fluoride, and then cleaning the interior of the deposition chamber with a cleaning gas selected from the group of argon and hydrogen in a plasma state.

9 Claims, 4 Drawing Sheets

METHOD FOR FORMING CARBONACEOUS FILMS

This application is a continuation of Ser. No. 07/392,547, filed Aug. 11, 1989, now abandoned.

BACKGROUND OF THE INVENTION

1. Field of the Invention

The present invention relates to a method for cleaning a device to form a film made from carbon or containing carbon as a main ingredient.

2. Description of the Prior Art

Conventionally, a carbonaceous film, that is a film made from carbon or containing carbon as a main ingredient, has superior resistance to abrasion, a high degree of smoothness, superior insulation characteristics, and superior resistance to chemicals, and the like, so that its practical application as a material having a wide variety of characteristics is expected. Coating technology for the carbonaceous film is known, for example, Japanese Laid Open Patent Application No. Sho-56-146930.

However, it is difficult to use the same deposition chamber many times to form such carbonaceous films because of problems such as vacuum reduction and flaking. After one or two cycles of forming the film, it becomes necessary to clean the inside of the deposition chamber. The gases which are used in conventional cleaning are, for example, hydrogen, oxygen, or gaseous fluoride for cleaning the solid film containing carbonaceous ingredients since a volatile gas is made in a plasma reaction with the carbonaceous ingredients. What is meant by the plasma reaction here is a reaction in which a plasma of hydrogen, oxygen or gaseous fluoride is formed for the reaction with the carbonaceous ingredients.

The technology of etching a carbonaceous film gives rise to difficult problems in the practical application to products of the carbonaceous film. For example, in a method of etching by carrying out a hydrocarbon type gasification reaction of the carbonaceous film with hydrogen to produce $C_xH_y$ or the like, the fouling of the inside of the deposition chamber is reduced, but, many problems occur due to the low etching velocity from the aspect of mass production velocity.

On the other hand, $O_2$ is the most convenient gas for use in plasma etching of the carbonaceous film, the greater part of which is exhausted in the form of CO, $CO_2$, and the like. However, part of the O and $O_2$ not to be reacted or CO and $CO_2$ remains on the inner walls. When the carbonaceous film is formed after a conventional cleaning, these gaseous ingredients tend to break away from the inner walls to diffuse in the vapor phase, resulting in auto-doping inside the film, or being trapped at the interface. Accordingly, the film quality and interface characteristics (particularly adhesion characteristics) deteriorate.

SUMMARY OF THE INVENTION

An object of the present invention is to provide, with due consideration to the drawbacks of such conventional methods, a method for cleaning a deposition chamber to form a film made from carbon or containing carbon as a main ingredient with the film quality and interface characteristics improved.

An object of the present invention is to provide a method for cleaning a deposition chamber to form a film made from carbon or containing carbon as a main ingredient, wherein substances such as O, $O_2$ or CO, $CO_2$ remaining on the inner walls after formation of the film is removed from the inner walls or is replaced by other gaseous substances, so that autodoping by the substances remaining on the inner walls is prevented.

These objects are achieved in the present invention by the provision of a plasma cleaning process comprising the steps of using an etching gas to remove a carbonaceous film deposited on the inside of the deposition chamber other than the film-forming surfaces of a substrate inside the deposition chamber, and then carrying out a plasma cleaning process with a cleaning gas, that is, an inactive gas such as Ar or an active gas such as $H_2$, whereby these gases remove O, $O_2$, CO, $CO_2$ and the like remaining on the walls or break them away from the walls by substitution, so that none of the O, $O_2$, CO, $CO_2$ and the like is leaving from the inside wall and diffusing in the vapor phase to mix into the formed film.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

The present invention will now be explained with reference to the embodiments.

Figure 1:
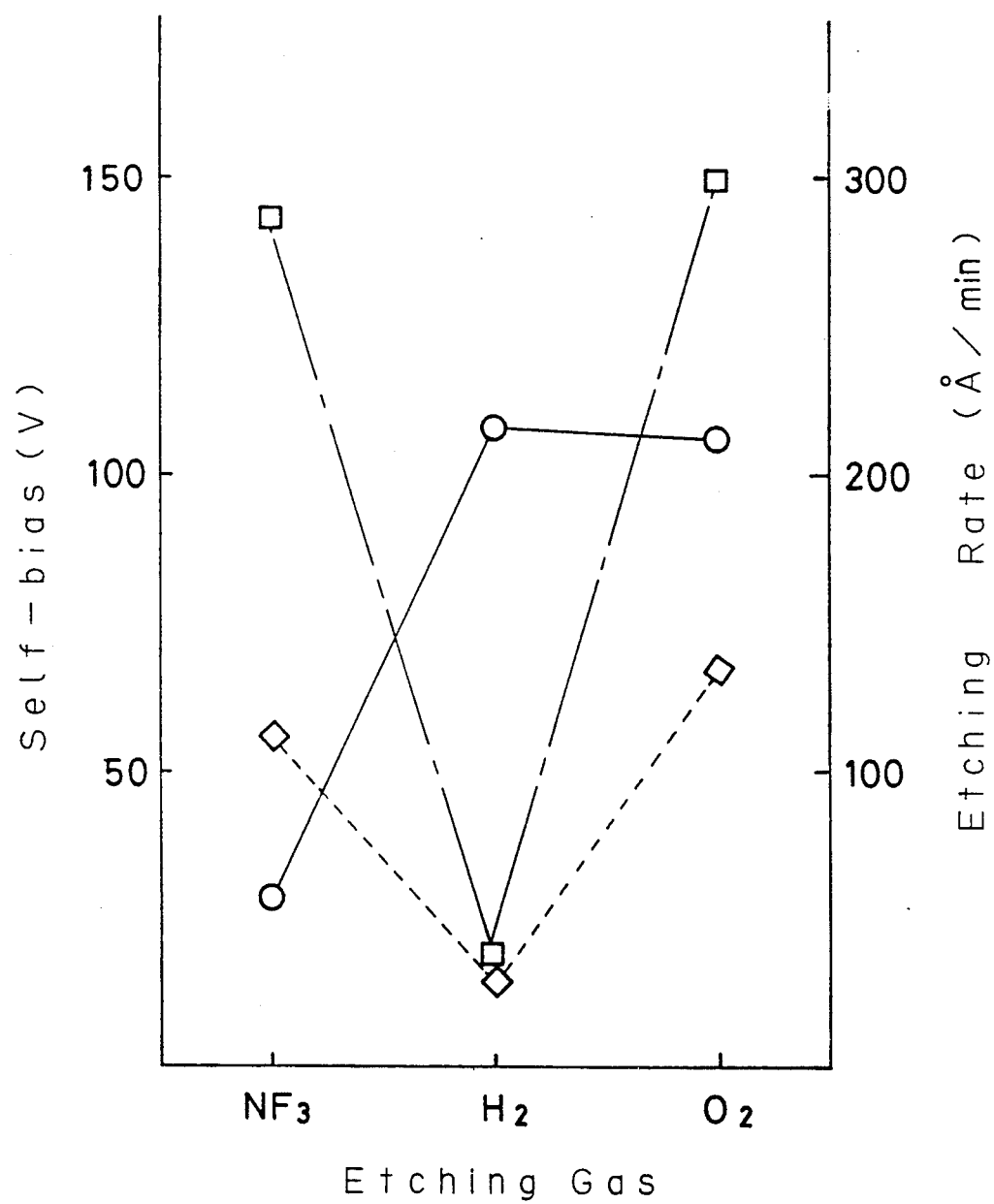
FIG. 1 is a graph showing the etching velocity and self-bias in various etching vapors.

FIG. 1 is a graph showing the etching velocity and the self-bias produced at electrodes applied with high frequency energy in the case where hard carbonaceous films of Vickers hardness of 1000 Kg/mm$^2$ and 2000 Kg/mm$^2$ were etched, using etching gases of $NF_3$, $H_2$, and $O_2$.

The self-bias is indicated in the graph by the ○ symbols, while the etching velocity is indicated by the □ symbols for a Vickers hardness of 1000 Kg/mm$^2$, and the  symbols for a Vickers hardness of 2000 Kg/mm$^2$. Here the high frequency energy was 60 W, the flow rate of the etching gas was 50 SCCM, the temperature was room temperature, and the reaction pressure was 3Pa.

Next, the followings show combination examples of methods for etching and cleaning inside the deposition chamber in the present invention.

Figure 2:
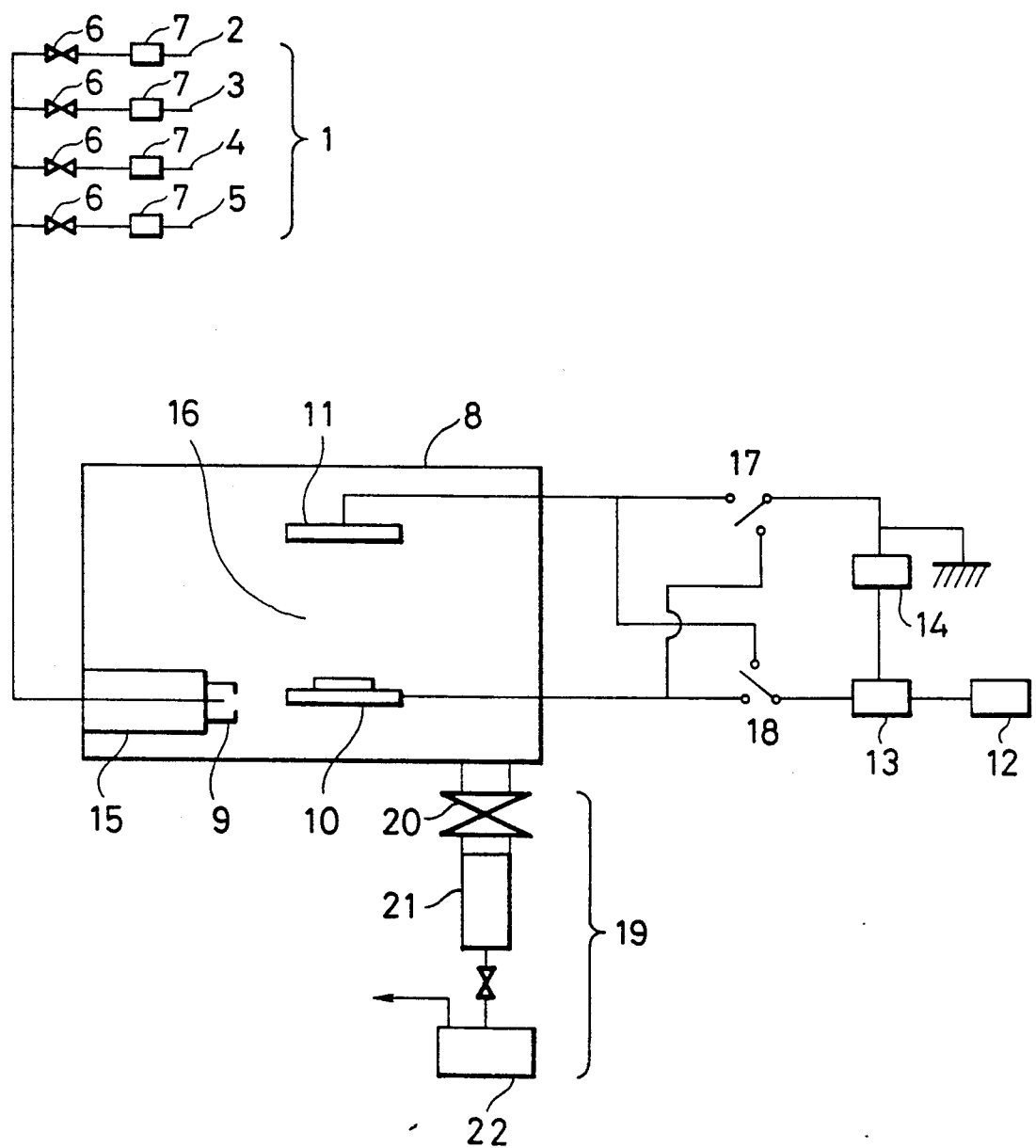
FIG. 2 is a schematic diagram showing the details of the plasma device used in the present invention.

(1) $O_2$ plasma etching + Ar plasma cleaning
(2) $NF_3$ plasma etching + Ar plasma cleaning
(3) $O_2$ plasma etching + $H_2$ plasma cleaning
(4) $NF_3$ plasma etching + $H_2$ plasma cleaning
(5) $H_2$ plasma etching + $H_2$ plasma cleaning Now referring to FIG. 2, this is a schematic diagram showing the details of a plasma device used in an embodiment of the present invention. This plasma device is a parallel plate type for plasma cleaning after a carbonaceous film is removed by etching.

The plasma device comprises a gas system 1 having a line 2 for hydrogen, a line 3 for hydrocarbon gas which is a reactive gas, a line 4 for etching-gas and a line 5 for cleaning-gas and etching-gas, a reaction system 8 having a first electrode 10, a second electrode 11, an injection nozzle 9 for introducing the gas from the gas system 1, a microwave excitation device 15 and a reaction space 16 enclosed in a deposition chamber, an electrical energy system having a high frequency power source 12, a matching transformer 13 and a DC bias power source 14, and a gas exhaust system 19 connected to the reaction system 8.

In the plasma device as mentioned above, an etching process and a film forming process are carried out under low pressure on a carbonaceous film in the reaction system 8, into which are introduced a hydrogen carrier gas through the line 2, a hydrocarbon gas such as methane or ethylene through the line 3, a gaseous fluoride for etching the carbonaceous film such as $NF_3$ through the line 4, and an etching and cleaning gas such as argon, hydrogen, oxygen through the line 5, via a valve 6 and a flow meter 7, and by means of the nozzle 9.

Electrical energy is applied between the pair of electrodes 10, 11 from the high frequency power source 12 through the matching transformer 13 and the DC bias power source 14, so that a plasma is generated.

In order to decompose the reactive gas in a higher degree, a 200 W to 2 KW microwave excitation device providing a microwave of 2.45 GHz is suitably applied at the microwave excitation device 15. This can increase the amount of activity of the reactive gas, so that the etching velocity can be increased by about, for example, 4 times in etching the carbonaceous film with oxygen.

The pressure of the reaction space 16 is maintained at a pressure of 0.01 to 1 Torr, for example, 0.1 Torr and high frequency electromagnetic energy is applied at 50 W to 5 KW to the reactive gases. In addition, a DC bias of $-200$ V to $+600$ V is applied (in actual practice, $-400$ V to $+400$ V) to the film forming surface. The reason for this is that when the DC bias is zero, there is an auto-bias of $-200$ V (the grounding level of the second electrode).

Figure 3A:
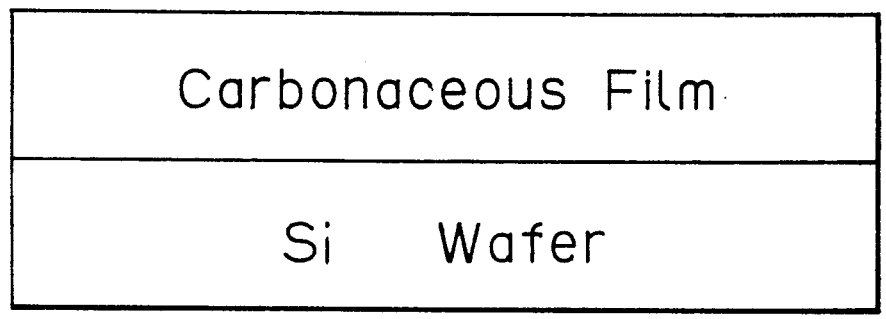
FIG. 3(A) and FIG. 3(B) are illustrations showing substrates used in the present invention and carbonaceous films formed on the substrates.
Figure 3B:
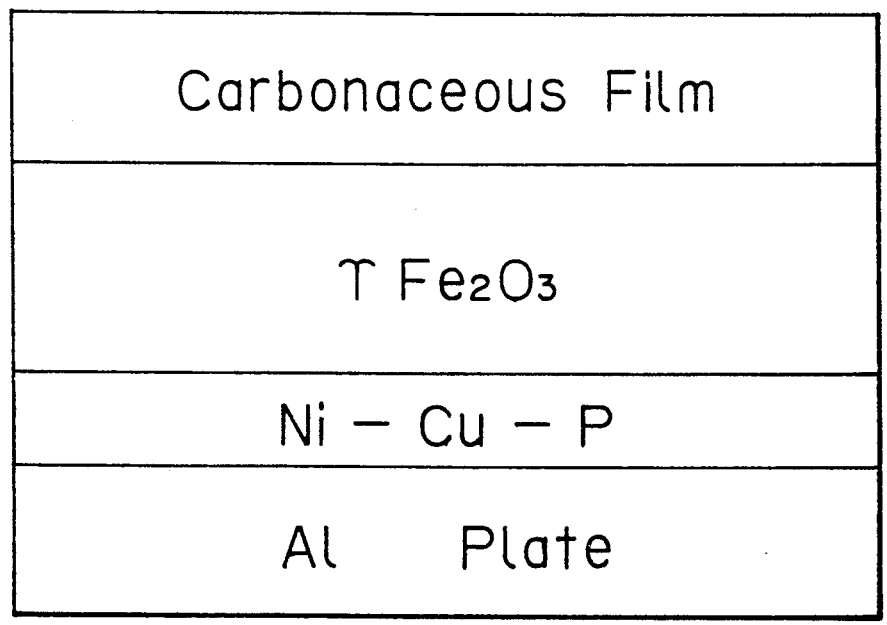

After the deposition chamber had been cleaned by the method of the present invention, a carbonaceous film was formed by a commonly known method on a substrate made from a Si wafer and on substrate made from an Al plate to which $\gamma Fe_2O_3$ is deposited for a magnetic recording medium, as shown in FIG. 3(A) and FIG. 3(B), respectively.

In this embodiment of the present invention, the methods of cleaning the deposition chamber are:
 a method using $H_2$ plasma only as an etching gas;
 a method using $O_2$ plasma only as an etching gas; and
 a method using $O_2$ plasma as an etching gas followed by $H_2$ plasma as a cleaning gas.

Table 1 shows the results of an abrasive test on a carbonaceous film using diamond paste of a particle size of 1 to 2 μm.

An evaluation in five stages was conducted. These stages are O, O∆, ∆, ∆X, and X. These results show a striking advantage in using $H_2$ plasma only and in using $O_2$ plasma plus $H_2$ plasma over in using the oxygen plasma only.

TABLE 1

| | Substrate | |
|---|---|---|
| Cleaning Method | Si | $\gamma Fe_2O_3$ |
| $H_2$ plasma etching + $H_2$ plasma cleaning | O | O |
| $O_2$ plasma etching only | ∆ | X |
| $O_2$ plasma etching + $H_2$ plasma cleaning | O | O∆ |

Comparing Si with $\gamma Fe_2O_3$ in Table 1, it would be noted that the adhesive characteristics in the contact between the carbonaceous film and the $\gamma Fe_2O_3$ decrease considerably, which is because a C—O bonding is normally formed at their interface. This can cause major problems when this film is utilized as a protective film for magnetic discs, etc.

Accordingly, from the results of the comparison shown in Table 1, the process in which $O_2$ is not used is considered to be basically good. However, it is clear that there is a considerable improvement in the adhesive characteristics even if the $O_2$ process is adopted for etching provided that for example the $H_2$ plasma cleaning is also used for substitution of oxygen with hydrogen.

Because the chemical bonding at the interface of an Si wafer is Si—C bonding, no great difference was in evidence, but when oxygen molecules, atoms, and radicals and the like remain on the Si surface, this would cause a reduction in the adhesive characteristics.

Because the etching velocity is severely retarded in $H_2$ plasma etching, a combination of $O_2$ plasma etching + $H_2$ plasma cleaning is thought to be best at the present time if it is desired to increase throughput for the mass production of the film.

Figure 4A:
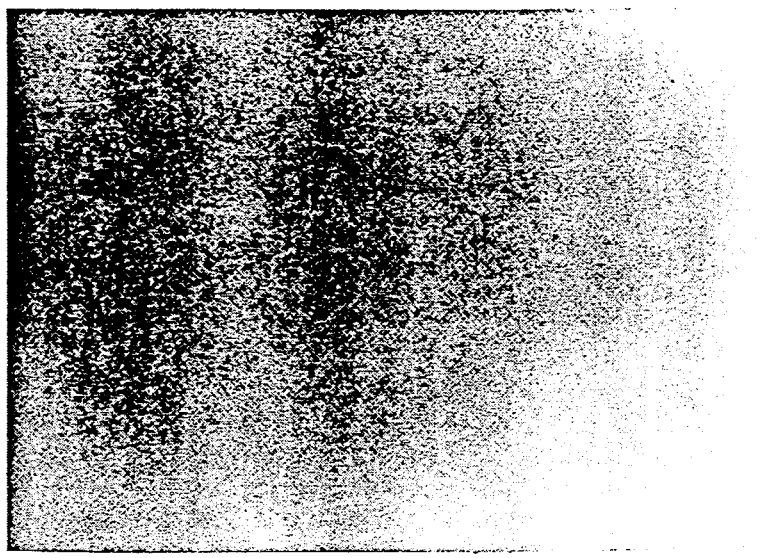
FIGS. 4(A) to 4(C) are photographs showing carbonaceous films on substrates after an abrasive test has been made on the carbonaceous films, respectively.

FIG. 4(A) is a microphotograph showing a carbonaceous film after an abrasive test has been made on the carbonaceous film formed on a substrate after the inside of the deposition chamber has been cleaned by hydrogen plasma etching followed by hydrogen plasma cleaning. The substrate is an Al plate to which $\gamma Fe_2O_3$, a magnetic recording medium, is attached.

Figure 4B:
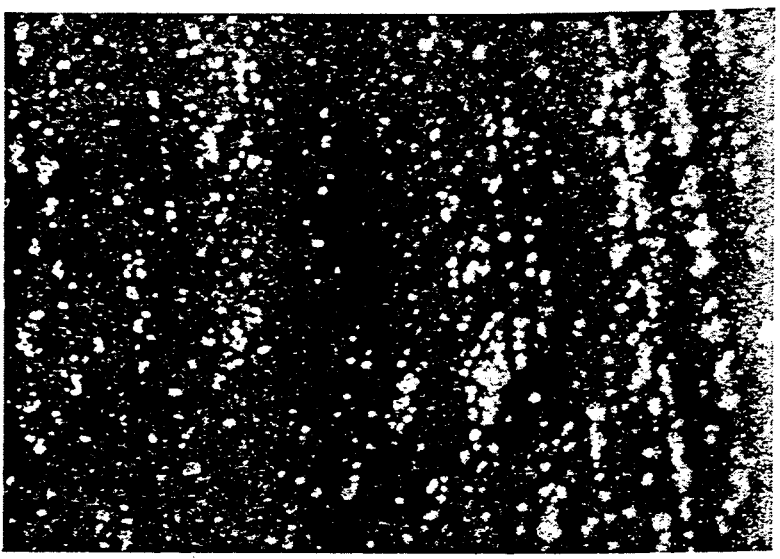

FIG. 4(B) is a microphotograph showing a carbonaceous film after an abrasive test has been made on the carbonaceous film formed on a substrate after the inside of the deposition chamber has been cleaned by oxygen plasma etching only. The substrate is an Al plate to which $\gamma Fe_2O_3$, a magnetic recording medium, is attached.

Figure 4C:
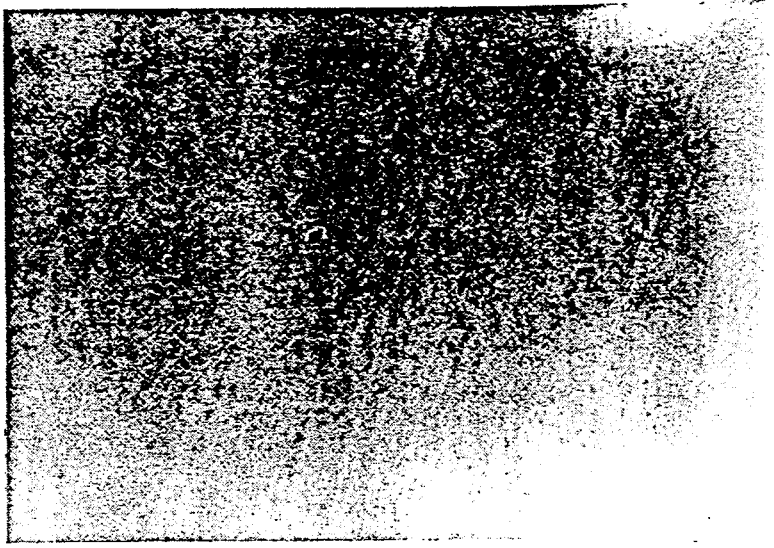

FIG. 4(C) is a microphotograph showing a carbonaceous film after an abrasive test has been made on the carbonaceous film formed on a substrate after the inside of the deposition chamber has been cleaned by oxygen plasma etching followed by hydrogen plasma cleaning. The substrate is an Al plate to which $\gamma Fe_2O_3$, a magnetic recording medium, is attached.

In FIG. 4(A) and FIG. 4(C), the sound carbonaceous film is seen, and no peeling of the film is observed.

On the other hand, in FIG. 4(B), some peeling is seen in the carbonaceous film, and the $\gamma Fe_2O_3$ underlayer is exposed.

In the present invention, when a carbonaceous film is formed on a substrate in a deposition chamber, where such carbonaceous films, that is made from carbon or containing carbon as the main ingredient, have adhered to the walls inside the deposition chamber in the preceding process, a cleaning gas such as, for example, Ar, $H_2$ is used for cleaning the deposition chamber after the films are removed from the walls through etching.

Because it is thus possible to thoroughly clean the inside of the deposition chamber, when the next film is formed in the inside of the deposition chamber which has been cleaned, since the O, $O_2$, or CO, $CO_2$ remaining on the inner walls of the deposition chamber had been degassed from the inner walls, no diffusion during the vapor phase occurs, and therefore, no material remaining on the inner walls of the deposition chamber shows auto-doping inside the film.

For this reason, no deterioration in the film quality and interface characteristics occurs, so that a major improvement is seen in the adhesion characteristics.

Because of these advantages, it has become possible for the first time to use the film forming device for a final passivation film on magnetic recording media such as magnetic tapes and disks and the like. It has also become possible to use the film forming device for a final coating of insulating film on semiconductor integrated circuits and the like.

Since other modification and changes (varied to fit particular operating requirements and environments) will be apparent to those skilled in the art, the invention is not considered limited to the examples chosen for purposes of disclosure, and covers all changes and modifications which do not constitute departures from the true spirit and scope of this invention.

What is claimed is:

1. A method for eliminating a carbonaceous substance deposited on inner walls of a reaction chamber, said method comprising the steps of:
   providing said reaction chamber with said inner walls;
   evacuating said reaction chamber;
   inputting an oxygen containing gas to said reaction chamber;
   inputting an electric energy to said reaction chamber to convert said oxygen containing gas to plasma so that said carbonaceous substance is removed from said inner walls of the reaction chamber;
   removing said oxygen containing gas and said carbonaceous substance from said reaction chamber where some of the oxygen containing gas may remain on the inner walls of the reaction chamber;
   inputting a hydrogen or an inactive gas to said reaction chamber after said oxygen containing gas and said carbonaceous substance are removed from the reaction chamber; and
   inputting an electric energy to said reaction chamber to convert said hydrogen or inactive gas to plasma so that at least oxygen from said oxygen containing gas remaining on the inner walls of the reaction chamber is eliminated from inside the reaction chamber.

2. The method of claim 1 wherein the inactive gas is an argon gas.

3. The method of claim 1 where a first processing step is performed in said reaction chamber to form a coating of said carbonaceous substance on a first substrate disposed within the reaction chamber and then the coated substrate is removed from the reaction chamber before said evacuating step and where the next processing step performed in said reaction chamber after the first processing step comprises forming said carbonaceous substance on a second substance disposed within the reaction chamber, said next processing step being performed after said oxygen from said oxygen containing gas remaining on the inner walls of the reaction chamber is eliminated.

4. The method of claim 3 where said first processing step and said next processing step are each a chemical vapor deposition step for respectively forming the carbonaceous substance on the first and second substrate.

5. A method for eliminating a carbonaceous substance deposited on inner walls of a reaction chamber, said method comprising the steps of:
   providing said reaction chamber with said inner walls;
   evacuating said reaction chamber;
   inputting a fluorine containing gas to said reaction chamber;
   inputting an electric energy to said reaction chamber to convert said fluorine containing gas to plasma so that said carbonaceous substance is removed from said inner walls of the reaction chamber;
   removing said fluorine containing gas and said carbonaceous substance from said reaction chamber where some of the fluorine containing gas may remain on the inner walls of the reaction chamber;
   inputting a hydrogen or an inactive gas to said reaction chamber after said fluorine containing gas and said carbonaceous substance are removed from the reaction chamber; and
   inputting an electric energy to said reaction chamber to convert said hydrogen or inactive gas to plasma so that at least fluorine from said fluorine containing gas remaining on the inner walls of the reaction chamber is eliminated from inside the reaction chamber.

6. The method of claim 5 wherein said fluorine containing gas is $NF_3$.

7. The method of claim 5 wherein said inactive; gas to an argon 6.

8. The method of claim 5 where a first processing step is performed in said reaction chamber to form a coating of said carbonaceous substance on a first substrate disposed within the reaction chamber and then the coated substrate is removed from the reaction chamber before said evacuating step and where the next processing step performed in said reaction chamber after the first processing step comprises forming said carbonaceous substance on a second substrate disposed within the reaction chamber, said next processing step being performed after said fluorine from said fluorine gas remaining on the inner walls of the reaction chamber is eliminated.

9. The method of claim 8 where said first processing step and said next processing step are each a chemical vapor deposition step for respectively forming the carbonaceous substance on the first and second substrates.

* * * * *